(12) United States Patent
Khlat

(10) Patent No.: US 12,476,613 B2
(45) Date of Patent: Nov. 18, 2025

(54) FILTER CIRCUITRY USING FERROELECTRIC TUNABLE ACOUSTIC RESONATOR

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 209 days.

(21) Appl. No.: 18/227,033

(22) Filed: Jul. 27, 2023

(65) Prior Publication Data

US 2024/0106412 A1  Mar. 28, 2024

Related U.S. Application Data

(60) Provisional application No. 63/410,413, filed on Sep. 27, 2022.

(51) Int. Cl.
*H03H 9/54* (2006.01)
*H03H 9/13* (2006.01)
*H03H 9/17* (2006.01)

(52) U.S. Cl.
CPC ............ *H03H 9/542* (2013.01); *H03H 9/133* (2013.01); *H03H 9/17* (2013.01)

(58) Field of Classification Search
CPC .......... H03H 9/542; H03H 9/133; H03H 9/17; H03H 7/09; H03H 9/589; H03H 9/178; H03H 9/564; H03H 9/585; H03H 9/175; H03H 9/02125; H03H 2009/02196; H03H 2009/02204

USPC .................................................. 333/186–188
See application file for complete search history.

(56) References Cited

U.S. PATENT DOCUMENTS

| | | | |
|---|---|---|---|
| 8,648,672 B2 | 2/2014 | Onzuka | |
| 9,837,984 B2 | 12/2017 | Khlat et al. | |
| 10,243,537 B2 | 3/2019 | Khlat | |
| 10,333,494 B2 | 6/2019 | Khlat et al. | |
| 11,431,316 B2 | 8/2022 | Khlat | |
| 2020/0099362 A1* | 3/2020 | Khlat | H03H 9/02007 |
| 2021/0409049 A1 | 12/2021 | Tabrizian et al. | |
| 2023/0223926 A1 | 7/2023 | Koohi et al. | |

* cited by examiner

*Primary Examiner* — Jorge L Salazar, Jr.
(74) *Attorney, Agent, or Firm* — Withrow & Terranova, P.L.L.C.

(57) ABSTRACT

The present disclosure relates to filter circuitry, which includes a first node and a second node, a series resonator coupled between the first node and the second node, and a compensation circuit coupled in parallel with the series resonator and located between the first node and the second node. Herein, the compensation circuit includes a tunable acoustic resonator with at least one transduction structure. The at least one transduction structure includes at least one ferroelectric material, and polarization of the at least one ferroelectric material varies with an electric field across the at least one ferroelectric material. Upon adjusting a direct current voltage applied to the tunable acoustic resonator, the compensation circuit is capable of providing a variable negative equivalent capacitance to at least partially cancel out an equivalent capacitance presented by the series resonator between the first node and the second node.

20 Claims, 10 Drawing Sheets

FILTER CIRCUITRY USING FERROELECTRIC TUNABLE ACOUSTIC RESONATOR

RELATED APPLICATIONS

This application claims the benefit of provisional patent application Ser. No. 63/410,413, filed Sep. 27, 2022, the disclosure of which is hereby incorporated herein by reference in its entirety.

FIELD OF THE DISCLOSURE

The present disclosure relates to filter circuitry using a ferroelectric tunable acoustic resonator, which at least partially cancels out undesired equivalent capacitance presented by a series resonator of the filter circuitry. The equivalent capacitance presented by the series resonator of the filter circuitry generally limits a bandwidth of the filter circuitry.

BACKGROUND

Acoustic resonators, such as Surface Acoustic Wave (SAW) resonators and Bulk Acoustic Wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, steep filter skirts and squared shoulders at the upper and lower ends of the passband, and need to provide excellent rejection outside of the passband. SAW-based and BAW-based filters also have relatively low insertion loss, tend to decrease in size as the frequency of operation increases, and are relatively stable over wide temperature ranges. As such, SAW-based and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

To better understand acoustic resonators and various terminology associated therewith, the following provides an overview of a BAW resonator. However, the concepts described herein may employ any type of acoustic resonator and are not limited to SAW-based and BAW-based resonators. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18 (which is sometimes referred to as a transduction layer), which is sandwiched between a top electrode 20 and a bottom electrode 22. The top and bottom electrodes 20 and 22 may be formed of Tungsten (W), Molybdenum (Mo), Platinum (Pt), or like materials, and the piezoelectric layer 18 may be formed of Aluminum Nitride (AlN), Zinc Oxide (ZnO), or other appropriate piezoelectric materials. Typically, electrical properties of the piezoelectric layer 18, including a polarization state, are not reconfigurable. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically propagating acoustic waves in the transducer 16. Acoustic waves traveling upward are reflected back into the transducer 16 by the air-metal boundary at the top surface of the top electrode 20. Acoustic waves traveling downward are reflected back into the transducer 16 by the reflector 14 or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 varies from one design to another.

The magnitude (Z) and phase (ϕ) of the electrical impedance as a function of the frequency for a relatively ideal BAW resonator 10 is provided in FIG. 2. The magnitude (Z) of the electrical impedance is illustrated by the solid line, whereas the phase (ϕ) of the electrical impedance is illustrated by the dashed line. A unique feature of the BAW resonator 10 is that it has both a resonance frequency and an anti-resonance frequency. The resonance frequency is typically referred to as the series resonance frequency (fs), and the anti-resonance frequency is typically referred to as the parallel resonance frequency (fp). The series resonance frequency (fs) occurs when the magnitude of the impedance, or reactance, of the BAW resonator 10 approaches zero. The parallel resonance frequency (fp) occurs when the magnitude of the impedance, or reactance, of the BAW resonator 10 peaks at a significantly high level. In general, the series resonance frequency (fs) is a function of the thickness of the piezoelectric layer 18 and the mass of the bottom and top electrodes 20 and 22.

For the phase (ϕ), the BAW resonator 10 acts like an inductance that provides a 90° phase shift between the series resonance frequency (fs) and the parallel resonance frequency (fp). In contrast, the BAW resonator 10 acts like a capacitance that provides a −90° phase shift below the series resonance frequency (fs) and above the parallel resonance frequency (fp). The BAW resonator 10 presents a very low, near zero, resistance at the series resonance frequency (fs) and a very high resistance at the parallel resonance frequency (fp). The electrical nature of the BAW resonator 10 lends itself to the realization of a very high Q (quality factor) inductance over a relatively short range of frequencies, which has proved to be very beneficial in high-frequency filter networks, especially those operating at frequencies around 1.8 GHz and above.

When using the BAW resonator 10 as a series element in an RF bandpass filter, preferably the series resonance frequency (fs) falls within a passband of the RF bandpass filter and the parallel resonance frequency (fp) falls outside of the passband of the RF bandpass filter. However, if an equivalent capacitance of the BAW resonator 10 (caused by its capacitor-like structure, which includes the top and bottom electrodes 20, 22 (FIG. 1) that are separated by the piezoelectric layer 18) is large, then a bandwidth of the RF bandpass filter may be too narrow to meet design requirements. Additionally, as frequency increases, impedance of the capacitance of the BAW resonator 10 drops, thereby degrading RF bandpass filtering performance at higher frequencies. Reducing the inherent capacitance of the BAW resonator 10 drives the parallel resonance frequency (fp) to higher values.

As noted previously, there is a constant need to improve the performance of acoustic resonators and filters that are based thereon. Those skilled in the art will appreciate the scope of the present disclosure and realize additional aspects thereof after reading the following detailed description of the preferred embodiments in association with the accompanying drawing figures.

Summary

The present disclosure relates to filter circuitry using a ferroelectric tunable acoustic resonator, which at least partially cancels out undesired equivalent capacitance presented by a series resonator of the filter circuitry. The disclosed filter circuitry includes a first node and a second node, the series resonator coupled between the first node and the second node, and a compensation circuit coupled in parallel with the series resonator and located between the first node and the second node. Herein, the compensation circuit includes a tunable acoustic resonator with at least one transduction structure. The at least one transduction structure includes at least one ferroelectric material, and polarization of the at least one ferroelectric material varies with an electric field across the at least one ferroelectric material. Upon adjusting a direct current (DC) voltage applied to the tunable acoustic resonator, the compensation circuit is capable of providing a variable negative equivalent capacitance to at least partially cancel out an equivalent capacitance presented by the series resonator between the first node and the second node.

In one embodiment of the filter circuitry, the at least one transduction structure is composed of a number of transduction layers, and at least one of the transduction layers is formed of one of the at least one ferroelectric material.

In one embodiment of the filter circuitry, the at least one ferroelectric material includes one or more of Scandium aluminum nitride (ScxAl1-xN) with variable scandium concentration x, Lead Zirconate Titanate (PZT), Lead titanate (PTO), Barium Titanate (BTO), and Hafnium Oxide (HfO2).

In one embodiment of the filter circuitry, the compensation circuit further includes a first inductor, a second inductor, a blocking capacitor, and a resistor. The first inductor and the second inductor are coupled in series between the first node and the second node, and a common node is provided between the first inductor and the second inductor. Herein, the first inductor and the second inductor are negatively coupled with one another. The blocking capacitor and the tunable acoustic resonator are coupled in series between the common node and ground. The DC voltage is applied to the tunable acoustic resonator via the resistor.

In one embodiment of the filter circuitry, the tunable acoustic resonator is a Bulk Acoustic Wave (BAW) resonator including a first electrode, a second electrode, and the at least one transduction structure coupled between the first electrode and the second electrode.

In one embodiment of the filter circuitry, the first electrode is coupled to the common node, the blocking capacitor is coupled between the second electrode and ground, and the DC voltage is applied to the second electrode via the resistor.

In one embodiment of the filter circuitry, the blocking capacitor is coupled between the common node and the first electrode, the second electrode is coupled to ground, and the DC voltage is applied to the first electrode via the resistor.

In one embodiment of the filter circuitry, the compensation circuit further a resistor. The first inductor and the second inductor are coupled in series between the first node and the second node, and a common node is provided between the first inductor and the second inductor. Herein, the first inductor and the second inductor are negatively coupled with one another. The tunable acoustic resonator includes a first electrode, a second electrode, a third electrode, and the at least one transduction structure. The at least one transduction structure includes a first transduction structure and a second transduction structure. Herein, the first electrode, the second electrode, and the first transduction structure coupled in between compose a first tunable BAW resonator, and the second electrode, the third electrode, and the second transduction structure coupled in between compose a second tunable BAW resonator. The first electrode of the tunable acoustic resonator is coupled to the common node and the third electrode of the tunable acoustic resonator is coupled to ground. The DC voltage is applied to the second electrode of the tunable acoustic resonator via the resistor.

In one embodiment of the filter circuitry, the first electrode of the tunable acoustic resonator is directly coupled to the common node and the third electrode of the tunable acoustic resonator is directly coupled to ground.

In one embodiment of the filter circuitry, the first tunable BAW resonator and the second tunable BAW resonator have opposite acoustic polarization states, such that, for opposite DC voltage variations, an equivalent capacitance presented by the first tunable BAW resonator and an equivalent capacitance presented by the second tunable BAW resonator increase or decrease simultaneously.

In one embodiment of the filter circuitry, the first tunable BAW resonator and the second tunable BAW resonator have a same acoustic polarization state with different scales, such that, for opposite DC voltage variations, an equivalent capacitance presented by the first tunable BAW resonator and an equivalent capacitance presented by the second tunable BAW resonators change oppositely, and an overall equivalent capacitance presented by the tunable acoustic resonator still varies with the applied DC voltage.

In one embodiment of the filter circuitry, the first transduction structure is composed of a number of first transduction layers, and at least one of the first transduction layers is formed of one of the at least one ferroelectric material. The second transduction structure is composed of a number of second transduction layers, and at least one of the second transduction layers is formed of one of the at least one ferroelectric material. Herein, the at least one ferroelectric material comprises one or more of $Sc_xAl_{1-x}N$ with variable scandium concentration x, PZT, PTO, BTO, and $HfO_2$.

In one embodiment of the filter circuitry, the first transduction structure and the second transduction structure include different ferroelectric materials.

In one embodiment of the filter circuitry, the compensation circuit further includes a blocking capacitor and a resistor. The tunable acoustic resonator includes a first electrode, a second electrode, a third electrode, and the at least one transduction structure that includes a first transduction structure and a second transduction structure. The first electrode, the second electrode, and the first transduction structure coupled in between compose a first tunable BAW resonator, and the second electrode, the third electrode, and the second transduction structure coupled in between compose a second tunable BAW resonator. The first electrode of the tunable acoustic resonator is coupled to the first node, and the third electrode of the tunable acoustic resonator is coupled to the second node. The blocking capacitor is coupled between the second electrode and ground, and the DC voltage is applied to the second electrode via the resistor.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
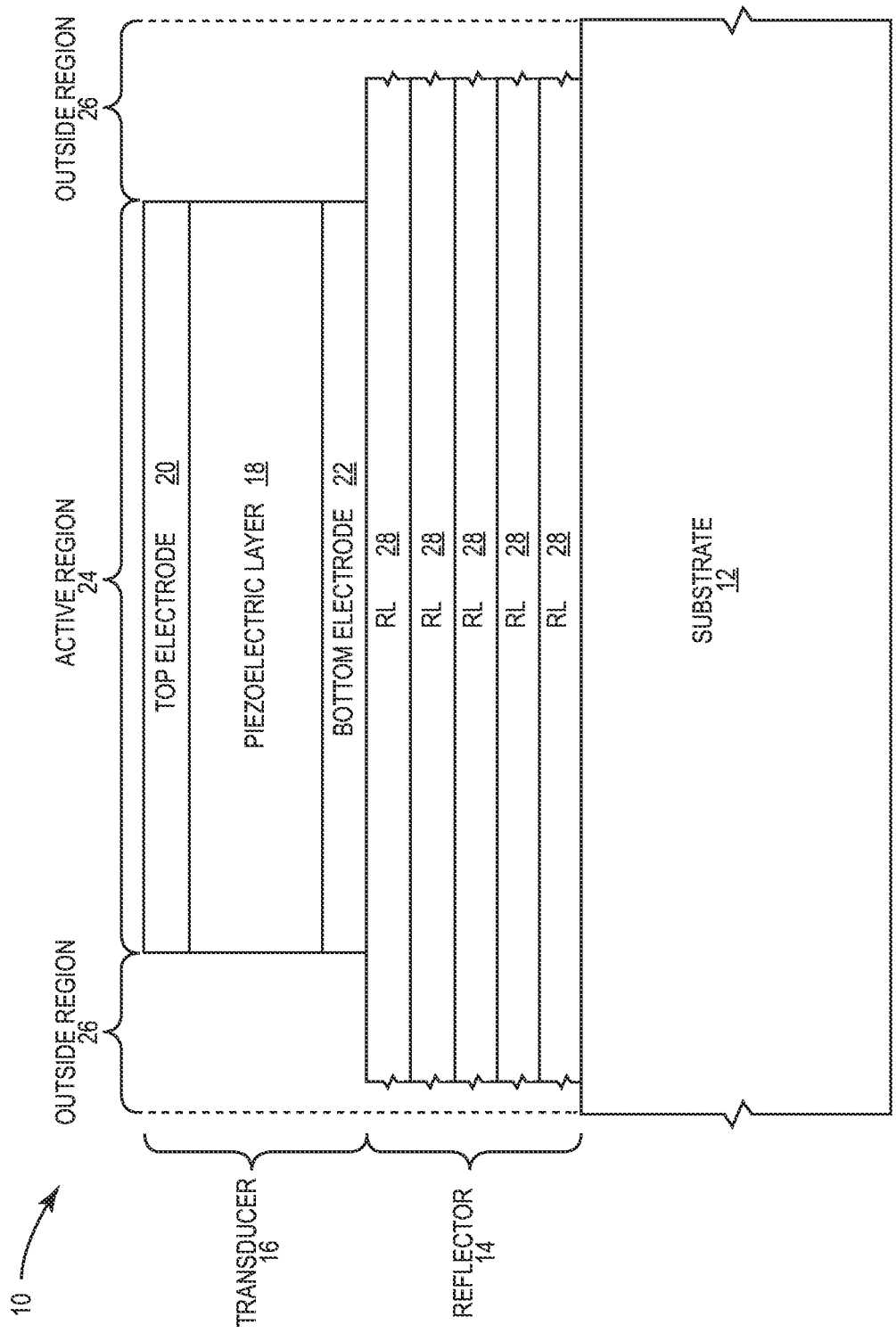
FIG. 1 illustrates a conventional Bulk Acoustic Wave (BAW) resonator.

It will be understood that for clear illustrations, FIGS. 1-10 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to filter circuitry using a ferroelectric tunable acoustic resonator, which at least partially cancels out undesired capacitance effect from a series resonator of the filter circuitry. The capacitance effect from the series resonator of the filter circuitry generally limits a bandwidth of the filter circuitry. Details are provided below.

Figure 3:
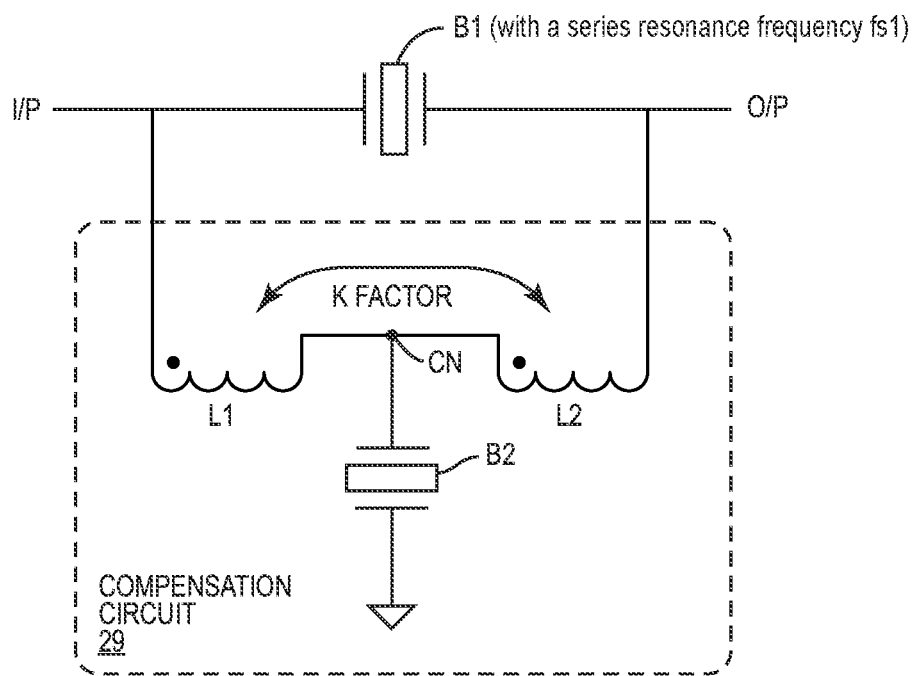
FIG. 3 illustrates an acoustic resonator in parallel with a compensation circuit, which includes a single shunt acoustic resonator.

Turning now to FIG. 3, a series resonator B1 is shown coupled between an input node VP and an output node O/P. The series resonator B1 has a series resonance frequency $f_{s1}$ and an equivalent capacitance, which generally limits a bandwidth of a filter that employs the series resonator B1. Typically, a frequency different from the series resonance frequency $f_{s1}$ will lead to a different equivalent capacitance presented by the series resonator B1. Once the frequency difference away from the series resonance frequency $f_{s1}$ is large enough, the series resonator B1 may act as a fixed capacitor. In the case of a Bulk Acoustic Wave (BAW) resonator, the equivalent capacitance of the series resonator B1 is primarily caused by its inherent structure, which looks and acts like a capacitor, in part because the series resonator includes the top and bottom electrodes 20, 22 (FIG. 1) that are separated by the piezoelectric layer 18. While BAW resonators are the focus of the example, other types of acoustic resonators, such as Surface Acoustic Wave (SAW) resonators, are equally applicable.

A compensation circuit 29 is coupled in parallel with the series resonator B1 and functions to compensate for some of the capacitance presented by the series resonator B1. The compensation circuit 29 includes two negatively coupled inductors L1, L2 and a shunt resonator B2. The inductors L1, L2 are coupled in series between the input node I/P and the output node O/P, where a common node CN is provided between the inductors L1, L2. The inductors L1, L2 are magnetically coupled by a coupling factor K, where dots illustrated in association with the inductors L1, L2 indicate that the magnetic coupling is negative. As such, the inductors L1, L2 are connected in electrical series and negatively coupled from a magnetic coupling perspective. As defined herein, two (or more) series-connected inductors that are negatively coupled from a magnetic perspective are inductors that are (1) connected in electrical series, and (2) the mutual inductance between the two inductors functions to decrease the total inductance of the two (or more) inductors. The shunt resonator B2 is coupled between the common node CN and ground (or another fixed voltage node).

To compensate for at least some of the capacitance of the series resonator B1, the compensation circuit 29 presents itself as a negative capacitance within certain frequency ranges, when coupled in parallel with the series resonator B1. Since capacitances in parallel are additives, providing a negative capacitance in parallel with the (positive) capacitance of the series resonator B1 effectively reduces the overall capacitance between the input node I/P and the output node O/P.

Figure 2:
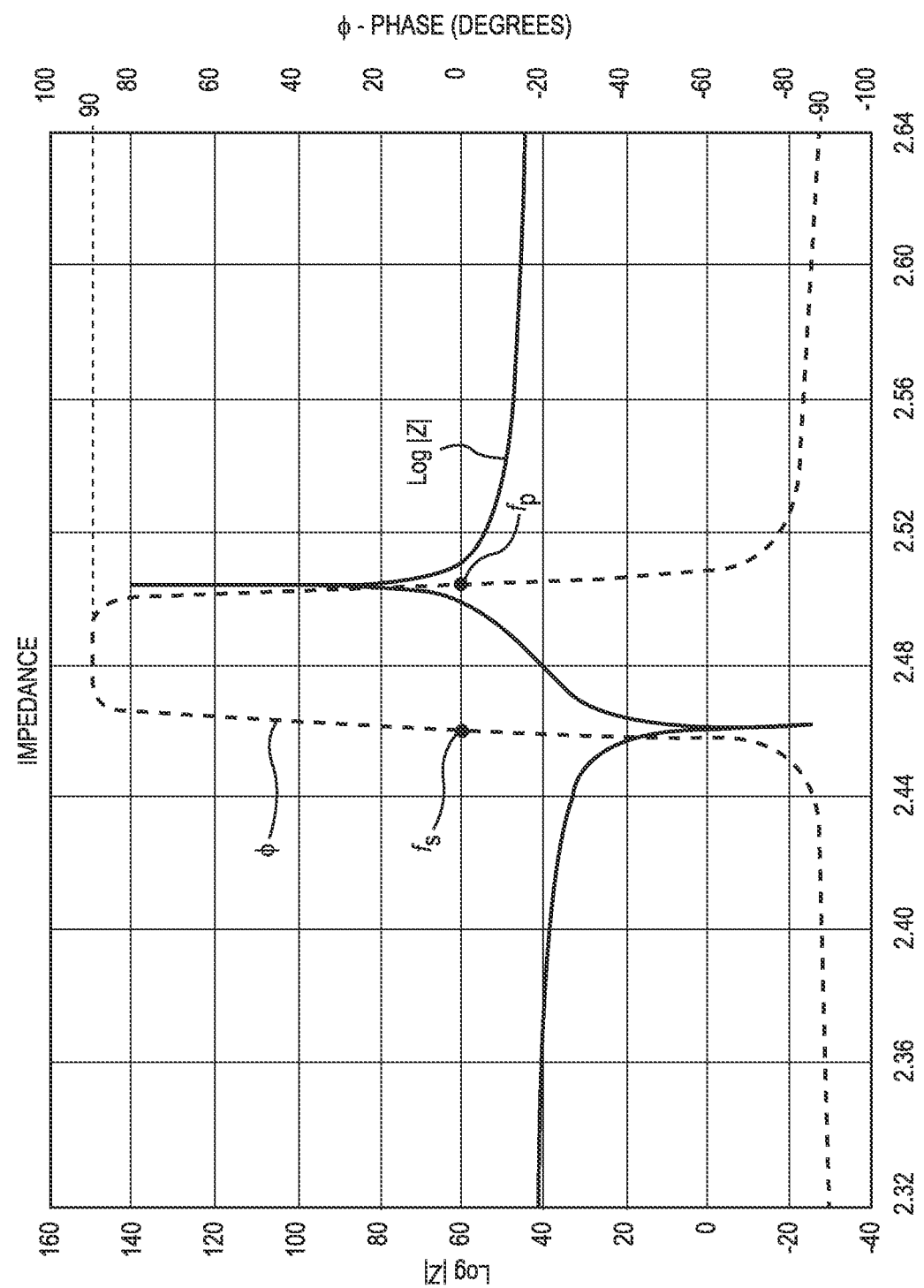
FIG. 2 is a graph of the magnitude and phase of impedance over frequency responses as a function of frequency for an ideal BAW resonator.
Figure 4:
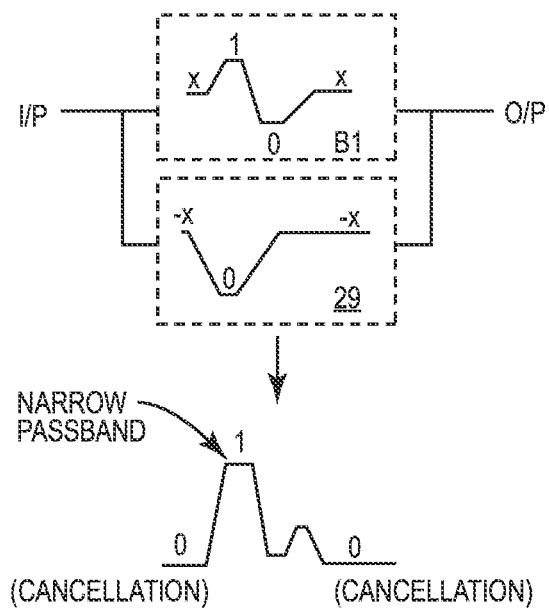
FIG. 4 is a graph that illustrates exemplary frequency responses for the acoustic resonator, compensation circuit, and overall filter circuit of FIG. 3.

Combined with the compensation circuit 29, the series resonator B1 can actually function as a filter (instead of just a resonator) and provide a passband, instead of a more traditional resonator response (solid line of FIG. 2). FIG. 4 graphically illustrates the frequency responses of the series resonator B1 (inside the block referenced B1), the compensation circuit 29 (inside the block referenced 29), and the filter circuit in which the compensation circuit 29 is placed in parallel with the series resonator B1. Further details on this particular circuit topology can be found in U.S. Pat. No. 9,837,984, issued Dec. 5, 2017, and titled RF LADDER FILTER WITH SIMPLIFIED ACOUSTIC RF RESONATOR PARALLEL CAPACITANCE COMPENSATION, and U.S. Pat. No. 10,333,494, issued Jun. 25, 2019, and titled SIMPLIFIED ACOUSTIC RF RESONATOR PARALLEL CAPACITANCE COMPENSATION, which are incorporated herein by reference.

Notice that the capacitance cancellation can be perfectly achieved when the negative equivalent capacitance provided by the compensation circuit 29 and the positive equivalent capacitance presented by the series resonator B1 have a same absolute value. For a non-limited example, when the equivalent capacitance presented by the shunt resonator B2 is four times the equivalent capacitance presented by the series resonator B1, the negative equivalent capacitance provided by the entire compensation circuit 29 can reach a negative value that can fully cancel out the (positive) equivalent capacitance presented by the series resonator B1. However, with a non-reconfigurable shunt resonator B2 (with a fixed series resonance frequency $f_{s2}$), the negative equivalent capacitance provided by the compensation circuit 29 cannot vary linearly with the equivalent capacitance presented by the series resonator B1 for different frequency ranges. The superior capacitance cancellation can only be achieved within certain frequency ranges. For frequencies away from these certain frequency ranges, the negative equivalent capacitance provided by the compensation circuit 29 and the positive equivalent capacitance presented by the series resonator B1 may not be perfectly cancelled out, and the capacitance cancellation between the input node I/P and the output node O/P will degrade.

The negative equivalent capacitance provided by the compensation circuit 29/the equivalent capacitance presented by the shunt resonator B2 will vary due to a variation of the series resonance frequency $f_{s2}$ of the shunt resonator B2. In other words, for a same signal frequency across the input node VP and the output node O/P, if the series resonance frequency $f_{s2}$ changes, a frequency difference between the signal frequency and the series resonance frequency $f_{s2}$ will change. As such, the equivalent capacitance presented by the shunt resonator B2 and the negative equivalent capacitance provided by the compensation circuit 29 will change. For one BAW resonator (e.g., the BAW resonator 10), a series resonance frequency of the BAW resonator is a function of a polarization P of a transduction layer of the BAW resonator. Therefore, once the polarization P of the transduction layer varies, the series resonance frequency of the BAW resonator will change accordingly, and consequently, an equivalent capacitance presented by such BAW resonator will change as well.

Figure 5A:
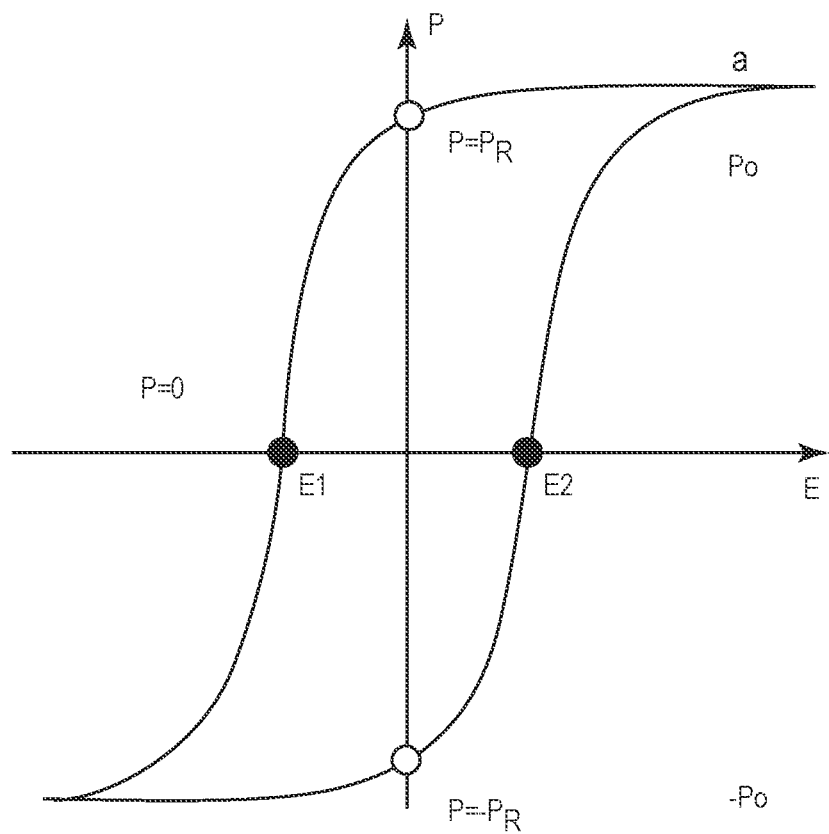
FIG. 5A illustrates an exemplary polarization—electric field (P-E) curve of a ferroelectric material.

FIG. 5A illustrates a simplified polarization—electric field (P-E) curve (i.e., hysteresis loop) of a ferroelectric material (herein, e.g., scandium aluminum nitride). It is clear that the polarization P of the ferroelectric material may be adjusted by changing the electric field E across the ferroelectric material. A variation amount of the polarization P is determined according to a variation amount of the electric field E across the ferroelectric material. Herein, changing the electric field E across the ferroelectric material may be implemented by applying different direct current (DC) bias voltages to the ferroelectric material. By applying a particular DC bias voltage to the ferroelectric material, the polarization P of the ferroelectric material can achieve a particular value. Each DC bias voltage corresponds to one polarization, depending on a clockwise or a counterclockwise movement on the P-E curve. For instance (e.g., moving on a counterclockwise direction), changing the electric field E across the ferroelectric material from 0 to E1 (i.e., by applying a particular DC bias voltage to the ferroelectric material), the polarization P of the ferroelectric material can be moved from $P=P_R$ to $P=0$. In another instance (e.g., moving in a clockwise direction), changing the electric field E across the ferroelectric material from E2 to 0, the polarization P of the ferroelectric material can be moved from $P=0$ to $P=-P_R$. As such, the series resonance frequency fs of the BAW resonator that utilizes the ferroelectric material in the transduction layer is variable. And in consequence, the equivalent capacitance presented by the BAW resonator that utilizes the ferroelectric material in the transduction layer can be tuned by the DC bias voltage applied across the ferroelectric transduction layer.

Notice that, once the polarization P of the ferroelectric material achieves a desired value (i.e., the equivalent capacitance presented by the BAW resonator achieves a desired value), there is no need to retain the DC bias voltage applied to the ferroelectric transduction layer. After removing the DC bias voltage, the polarization P of the ferroelectric material (i.e., the equivalent capacitance presented by the BAW resonator) will remain at that desired value, until another DC bias voltage is applied to the ferroelectric transduction layer.

Figure 5B:
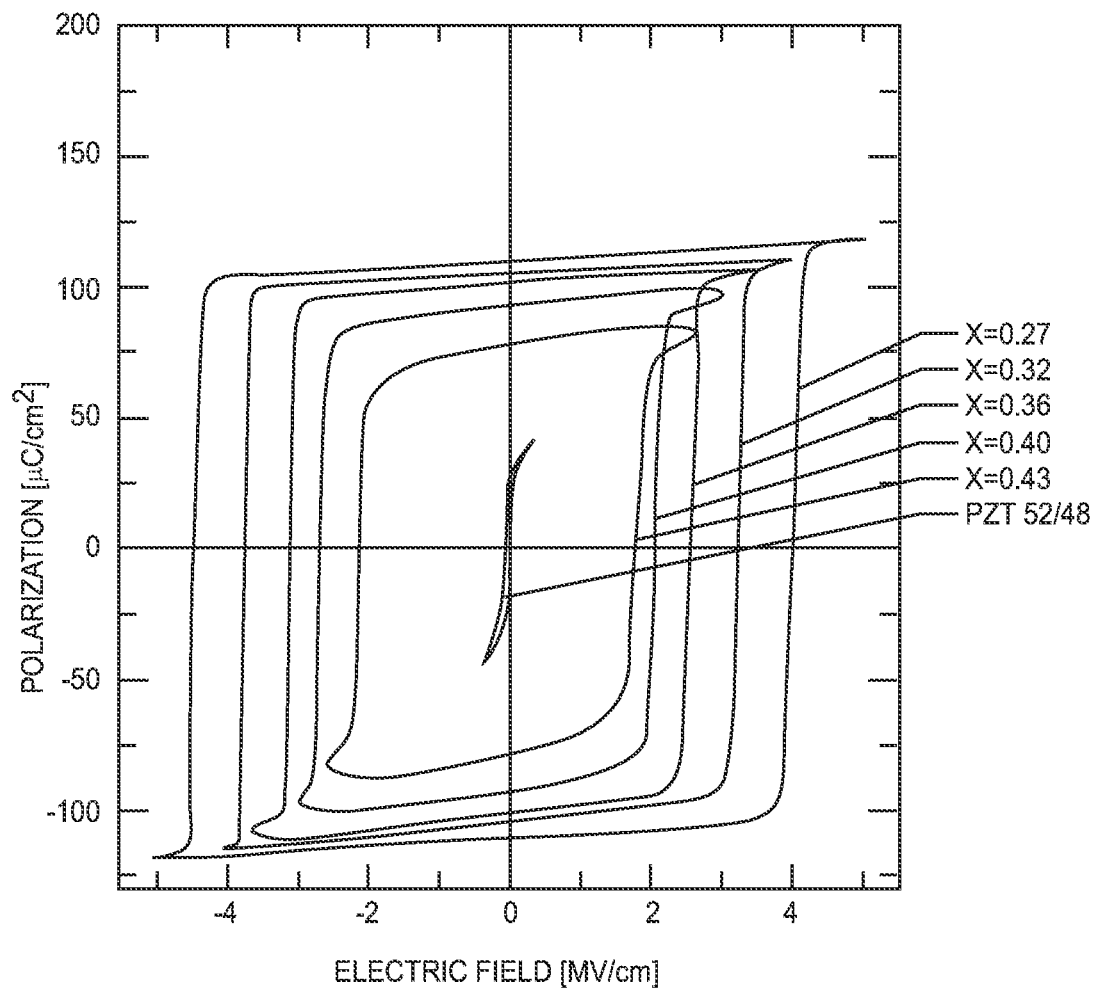
FIG. 5B illustrates exemplary different P-E curves of scandium aluminum nitride ($Sc_xAl_{1-x}N$) dependency on scandium concentration x.

Scandium aluminum nitride ($Sc_xAl_{1-x}N$) is an exemplary ferroelectric material. FIG. 5B illustrates exemplary different P-E curves of $Sc_xAl_{1-x}N$ dependent on a scandium concentration x. With a same electric field E (applying a same DC bias voltage), the polarization P of $Sc_xAl_{1-x}N$ may have different values and/or different directions due to the scandium concentration x. As such, the equivalent capacitance presented by the BAW resonator, which is dependent on the polarization P of ferroelectric material, may also have different values due to the scandium concentration x.

Figure 6:
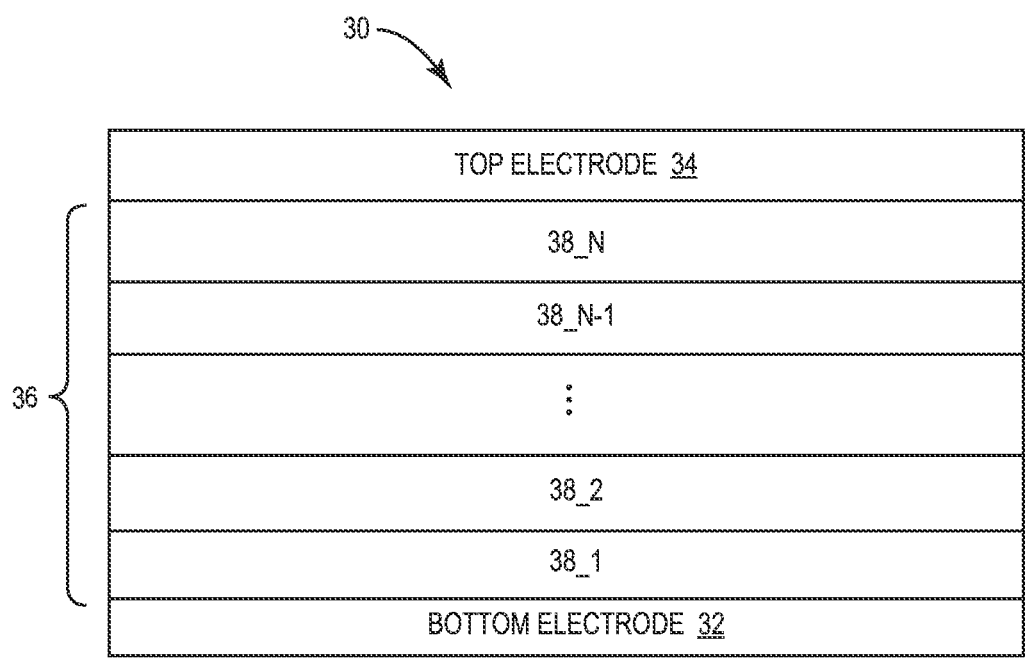
FIG. 6 illustrates an exemplary tunable BAW resonator, which is capable of achieving tunable polarization/tunable series resonance frequency.

FIG. 6 illustrates an exemplary tunable BAW resonator 30, which is capable of achieving tunable polarization/tunable series resonance frequency fs. The exemplary BAW resonator 30 includes a bottom electrode 32, a top electrode 34, and a multilayer transduction structure 36 sandwiched between the bottom electrode 32 and the top electrode 34 (reflector and/or substrate are omitted for simplicity).

The multilayer transduction structure 36 includes multiple transduction layers 38, each of which may have a same or different thickness. At least one of the transduction layers 38 is formed of a ferroelectric material, whose polarization will vary with an electric field across the ferroelectric material. For instance, the ferroelectric material used for the at least one of the transduction layers 38 has a box-shaped P-E curve (e.g., as shown in FIG. 5A), such as $Sc_xAl_{1-x}N$, Lead Zirconate Titanate (PZT), Lead titanate (PTO), Barium Titanate (BTO), Hafnium Oxide ($HfO_2$) or the like. As such, once the electric field across the multilayer transduction structure 36 changes, the polarization of the at least one transduction layer 38 will change accordingly, an overall polarization of the entire multilayer transduction structure 36 will change, the series resonance frequency fs of the tunable BAW resonator 30 will change, and an equivalent capacitance presented by the tunable BAW resonator 30 will change. Further details on the tunable BAW resonator 30 can be found in U.S. provisional patent application No. 63/324,946, filed Mar. 29, 2022 (now U.S. utility patent application number 18/150,614, filed Jan. 5, 2023) and titled BULK ACOUSTIC WAVE RESONATOR WITH TUNABLE ELECTROMECHANICAL COUPLING, which is incorporated herein by reference.

Figure 7A:
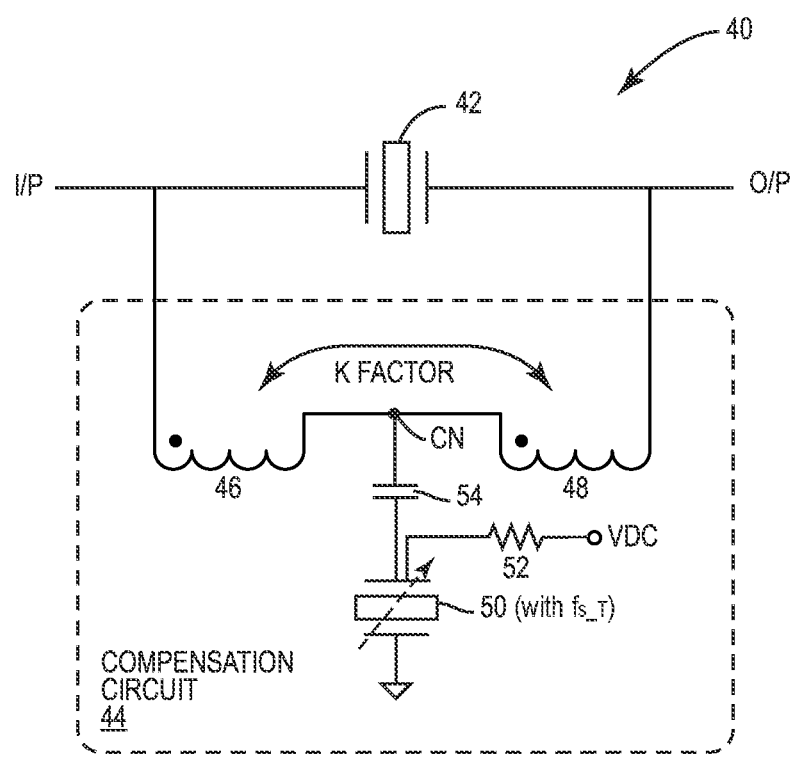
FIGS. 7A-7B show exemplary filter circuitry using a ferroelectric tunable acoustic resonator as a shunt resonator according to some embodiments of the present disclosure.
Figure 7B:
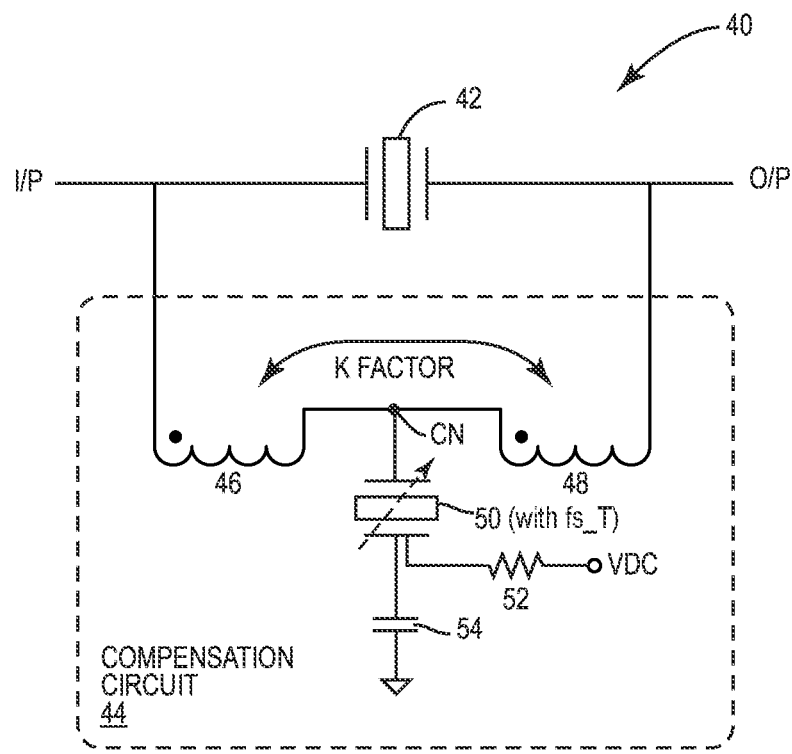

FIGS. 7A-7B show exemplary filter circuitry 40 using a ferroelectric tunable acoustic resonator as a shunt resonator according to some embodiments of the present disclosure. The filter circuitry 40 includes an input node VP, an output node O/P, a series resonator 42 coupled between the input node VP and the output node O/P, and a compensation circuit 44, which is in parallel with the series resonator 42 and coupled between the input node VP and the output node O/P.

The compensation circuit 44 is reconfigurable and eligible to substantially compensate for an inherent capacitance presented by the series resonator 42 in different frequency ranges. Herein, "substantially compensate for a capacitance" refers to "cancel 95% of the capacitance." The compensation circuit 44 includes a first inductor 46, a second inductor 48, and a tunable acoustic resonator 50. The first inductor 46 and the second inductor 48 are connected in series between the input node VP and the output node O/P, where a common node CN is provided between the first and second inductors 46 and 48. The first and second inductors 46 and 48 are magnetically coupled by a coupling factor K, where dots illustrated in association with the first and second inductors 46 and 48 indicate that the magnetic coupling is negative. As such, the first and second inductors 46 and 48 are connected in electrical series and negatively coupled from a magnetic coupling perspective.

The tunable acoustic resonator 50 is a shunt resonator coupled between the common node CN and ground (or another fixed voltage node). The tunable acoustic resonator 50 may be implemented as the BAW resonator 30 shown in FIG. 6 (i.e., at least one of the transduction layers 38 within the BAW resonator 30 is formed of a ferroelectric material, whose polarization will vary with an electric field/DC voltage across the ferroelectric material). As such, by applying different DC voltages to the tunable acoustic resonator 50, a series resonance frequency $f_{s\_T}$ of the tunable acoustic resonator 50 will change, and an overall equivalent capacitance presented by the tunable acoustic resonator 50 will change. In consequence, the negative equivalent capacitance of the compensation circuit 44 can be tuned by different DC voltages applied to the tunable acoustic resonator 50. For different frequency applications, the positive equivalent capacitance presented by the series resonator 42 is different. However, since the compensation circuit 44 is eligible to provide a variable negative capacitance, an overall capacitance between the input node I/P and the output node O/P can still achieve substantially zero.

In one embodiment, a DC terminal VDC, which provides the DC voltage, is coupled to a top electrode (e.g., the top electrode 34 in the BAW resonator 30) of the tunable acoustic resonator 50 via a resistor 52, as illustrated in FIG. 7A. The resistor 52 is configured to prevent RF signals leaking towards the DC terminal VDC. In addition, the compensation circuit 44 may further include a blocking capacitor 54 coupled between the top electrode of the tunable acoustic resonator 50 and the common node CN. The blocking capacitor 54 is configured to avoid coupling the DC voltage provided by the DC terminal VDC across the input node I/P and the output node O/P.

In one embodiment, the DC terminal VDC is coupled to a bottom electrode (e.g., the top electrode 32 in the BAW resonator 30) of the tunable acoustic resonator 50 via the resistor 52, as illustrated in FIG. 7B. The resistor 52 is configured to prevent RF signals leaking towards the DC terminal VDC. In addition, the blocking capacitor 54 is coupled between the bottom electrode of the tunable acoustic resonator 50 and ground. Herein, there is no need to have a capacitor between the tunable acoustic resonator 50 and the common node CN, since the equivalent capacitance provided by the tunable acoustic resonator 50 is between the DC terminal VDC and the common node CN.

Figure 8:
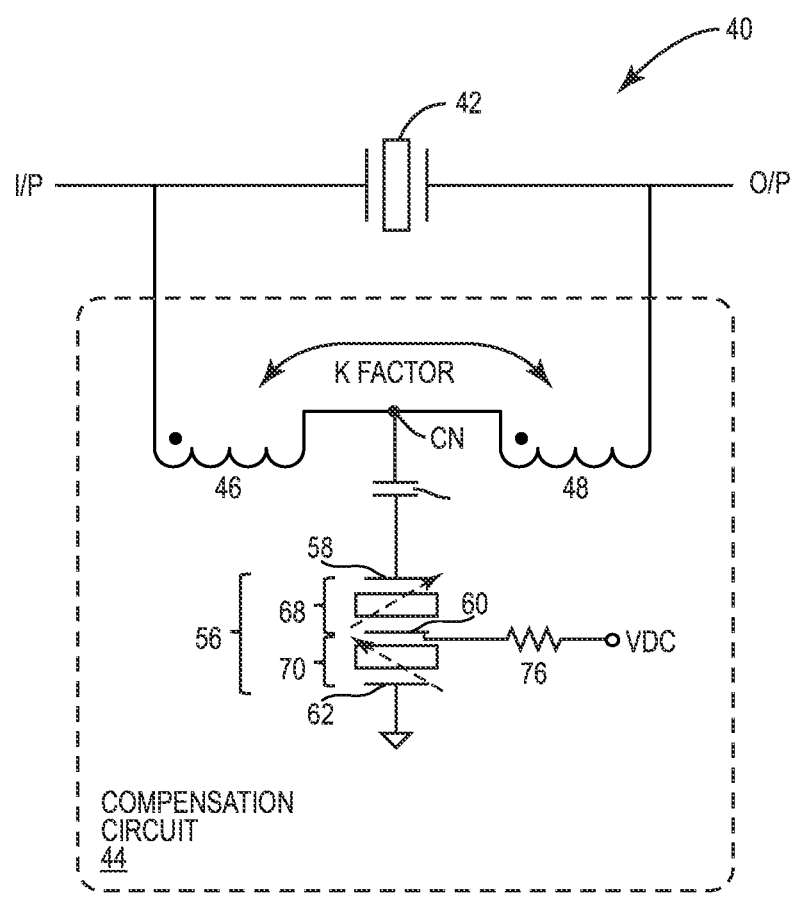
FIG. 8 illustrates exemplary filter circuitry using a stacked tunable acoustic resonator as a shunt resonator according to some embodiments of the present disclosure.

Instead of using the blocking capacitor 54 to avoid coupling the DC voltage (provided by the DC terminal VDC) across the input node VP and the output node O/P, the compensation circuit 44 can utilize a stacked tunable acoustic resonator 56 in the shunt path, as illustrated in FIG. 8. The stacked tunable acoustic resonator 56 is coupled between the common node CN and ground without any extra capacitor in between.

Figure 9:
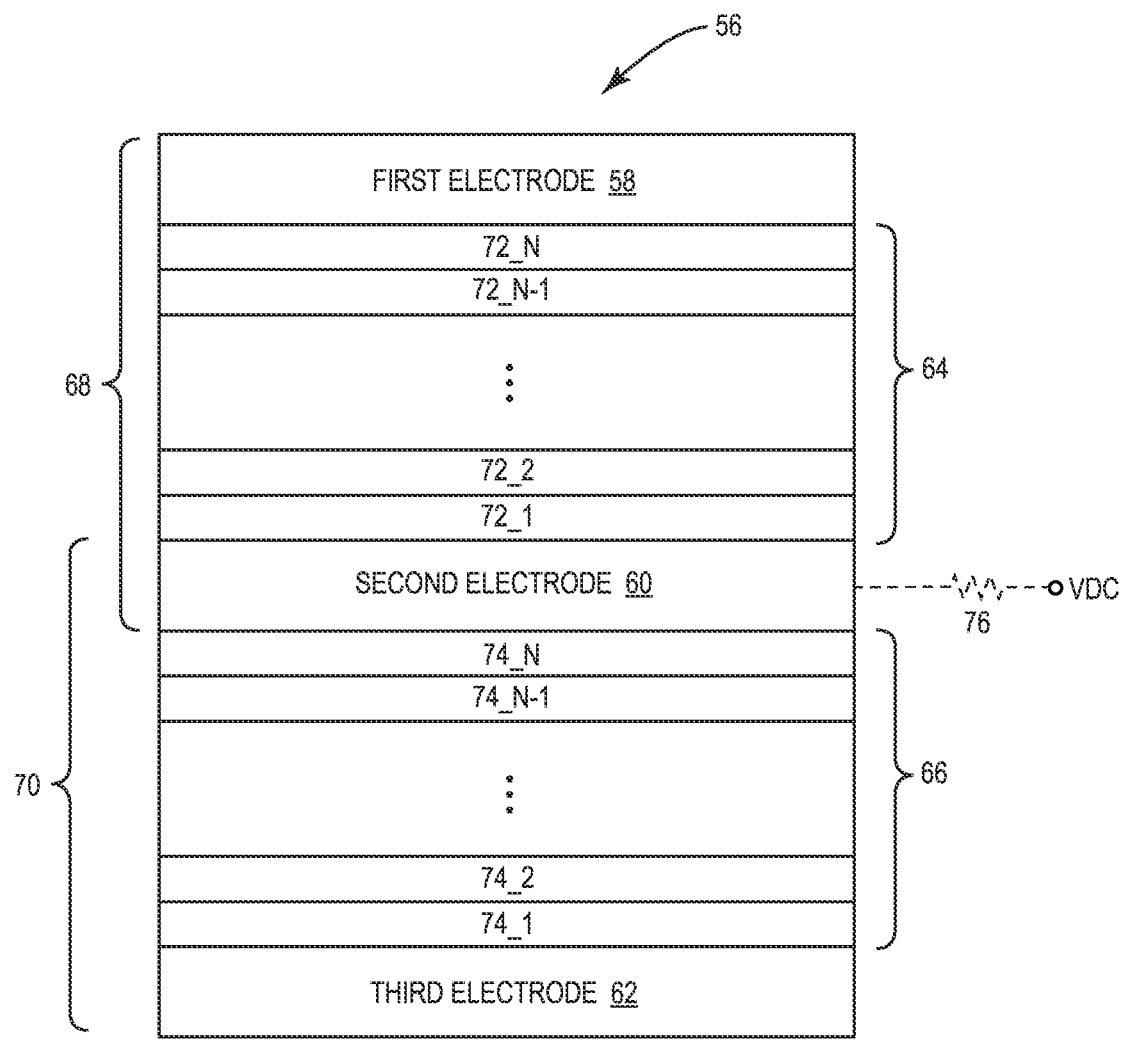
FIG. 9 illustrates an exemplary implementation of the stacked tunable acoustic resonator shown in FIG. 8.

FIG. 9 illustrates a non-limited exemplary implementation of the stacked tunable acoustic resonator 56. In this illustration, the stacked tunable acoustic resonator 56 is a stacked tunable BAW resonator, which includes a first electrode 58, a second electrode 60, a third electrode 62, a first transduction structure 64, and a second transduction structure 66. The first electrode 58 is coupled to the common node CN, and the third electrode 62 is coupled to ground. The first transduction structure 64 is vertically between the first electrode 58 and the second electrode 60, while the second transduction structure 66 is vertically between the second electrode 60 and the third electrode 62.

The first electrode 58, the second electrode 60, and the first transduction structure 64 in between compose a first tunable BAW resonator 68, while the second electrode 60, the third electrode 62, and the second transduction structure 66 in between compose a second tunable BAW resonator 70. Herein, the first tunable BAW resonator 68 and the second tunable BAW resonator 70 share the common electrode 60 and form a back-to-back configuration. In this illustration, the DC terminal VDC is coupled to the second electrode 60 via a resistor 76. When the DC voltage provided by the DC terminal VDC is high (e.g., 50 V), the DC voltage across the first tunable BAW resonator 68 and the DC voltage across the second tunable BAW resonator 70 have opposite polarities (a voltage at the common node CN is lower than the DC voltage provided by the DC terminal VDC). As such, when the DC voltage applied to the second electrode 60 is positive and high, the DC voltage across the second tunable BAW resonator 70 is positive, while the DC voltage across the first tunable BAW resonator 68 is negative. Furthermore, when the positive voltage applied to the second electrode 60 further increases, the DC voltage across the second tunable BAW resonator 70 increases and the DC voltage across the first tunable BAW resonator 68 decreases (e.g., greater negative value).

The first transduction structure 64 includes multiple first transduction layers 72, each of which may have a same or different thickness. At least one of the first transduction layers 72 is formed of a ferroelectric material, such as $Sc_xAl_{1-x}N$, PZT, PTO, BTO, $HfO_2$ or the like. Once the DC voltage (i.e., electric field) across the first transduction structure 64 changes, a series resonance frequency of the first tunable BAW resonator 68 will change, and thus an equivalent capacitance presented by the first tunable BAW resonator 68 will change accordingly.

Similarly, the second transduction structure 66 includes multiple second transduction layers 74, each of which may have a same or different thickness. At least one of the second transduction layers 74 is formed of a ferroelectric material, such as $Sc_xAl_{1-x}N$, PZT, PTO, BTO, $HfO_2$ or the like. Once the DC voltage (i.e., electric field) across the second transduction structure 66 changes, a series resonance frequency of the second tunable BAW resonator 70 will change, and thus an equivalent capacitance presented by the second tunable BAW resonator 70 will change accordingly. The ferroelectric material(s) used in the first transduction structure 64 and the second transduction structure 66 may be different.

Notice that there is no need to have a capacitor between the common node CN and the first electrode 58 since the equivalent capacitance provided by the first tunable BAW resonator 68 is between the DC terminal VDC and the common node CN. In addition, there is no need to have a capacitor between the third electrode 62 and ground since the equivalent capacitance provided by the second tunable BAW resonator 70 is between the DC terminal VDC and ground.

In one embodiment, the first tunable BAW resonator 68 and the second tunable BAW resonator 70 have opposite acoustic polarization states. In other words, for a same DC voltage variation, a series resonance frequency of one tunable BAW resonator (e.g., the first tunable BAW resonator 68) will decrease while a series resonance frequency of the other tunable BAW resonator (e.g., the second tunable BAW resonator 70) will increase. As such, for opposite DC voltage variations, the series resonance frequencies of the first and second tunable BAW resonators 68 and 70 will increase or decrease at a same time. In consequence, for opposite DC voltage variations, the equivalent capacitances of the first and second tunable BAW resonators 68 and 70 increase or decrease at a same time. For a non-limited example, when the DC voltage applied to the second electrode 60 is positive and increases (i.e., the DC voltage across the second tunable BAW resonator 70 is positive and increases, and the DC voltage across the first tunable BAW resonator 68 is negative and decreases to a greater negative value), the equivalent capacitance of the first tunable BAW resonator 68 and the equivalent capacitance of the second tunable BAW resonator 70 both increase with a same or different scale. In some extreme cases, when the DC voltage applied to the second electrode 60 changes, only one tunable BAW resonator 68/70 changes its equivalent capacitance, while the other one remains the same.

In one embodiment, the first tunable BAW resonator 68 and the second tunable BAW resonator 70 have a same acoustic polarization state. In other words, for opposite DC voltage variations, the equivalent capacitances of the first and second tunable BAW resonators 68 and 70 change oppositely. For a non-limited example, when the DC voltage applied to the second electrode 60 is positive and increases (i.e., the DC voltage across the second tunable BAW resonator 70 is positive and increases, while the DC voltage across the first tunable BAW resonator 68 is negative and decreases to a greater negative value), the equivalent capacitance of the first tunable BAW resonator 68 decreases and the equivalent capacitance of the second tunable BAW resonator 70 increases (with different scales). An overall equivalent capacitance presented by the stacked tunable acoustic resonator 56 still varies with the applied DC voltage.

Figure 10:
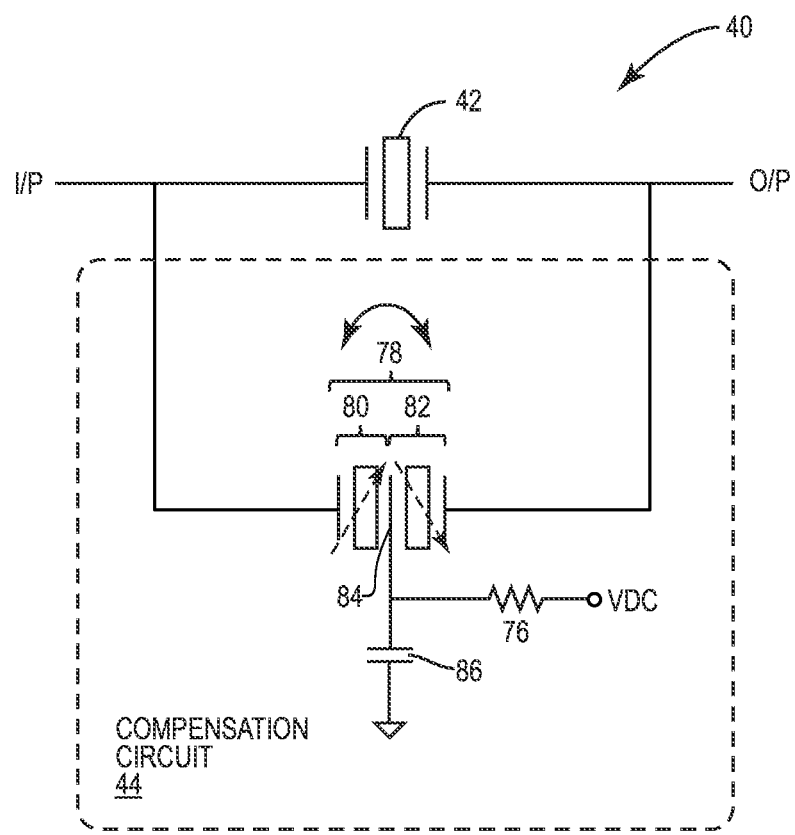
FIG. 10 illustrates alternative filter circuitry using a stacked tunable acoustic resonator according to some embodiments of the present disclosure.

For some applications, the first and second inductors 46 and 48 are omitted in the compensation circuit 44, and, instead, a stacked tunable acoustic resonator 78 coupled between the input node I/P and the output node O/P is included in the compensation circuit 44, as illustrated in FIG. 10. Herein, the stacked tunable acoustic resonator 78 may be implemented as the stacked tunable BAW resonator 56 shown in FIG. 9. The stacked tunable acoustic resonator 78 provides a first tunable BAW resonator 80 (similar to the first tunable BAW resonator 68 of the stacked tunable BAW resonator 56) and a second tunable BAW resonator 82 (similar to the second tunable BAW resonator 70 of the stacked tunable BAW resonator 56) sharing a common electrode 84 (similar to the second electrode 60 of the stacked tunable BAW resonator 56). The first tunable BAW resonator 80 and the second tunable BAW resonator 82 of the stacked tunable acoustic resonator 78 have opposite acoustic polarization states. In addition, the first tunable BAW resonator 80 and the second tunable BAW resonator 82 are mechanically coupled and also function as negatively coupled inductors (i.e., acoustic-based inductors). Further details on one stacked tunable acoustic resonator connected between the input node I/P and the output node O/P can be found in U.S. patent application Ser. No. 16/356,279, filed Mar. 18, 2019, and titled ACOUSTIC RESONATOR STRUCTURE (now U.S. Pat. No. 11,431,316), which is incorporated herein by reference.

The DC terminal VDC is coupled to the common electrode 84 via the resistor 76. When the DC voltage applied to the common electrode 84 changes, the DC voltage across the first tunable BAW resonator 80 and the DC voltage across the second tunable BAW resonator 82 will change oppositely. Because the first tunable BAW resonator 80 and the second tunable BAW resonator 82 have opposite acoustic polarization states, when the DC voltage applied to the common electrode 84 changes, the equivalent capacitances of the first and second tunable BAW resonators 68 and 70 increase or decrease at the same time. In consequence, the negative equivalent capacitance provided by the compensation circuit 44 can be tuned. Furthermore, in this illustration, the compensation circuit 44 also includes a capacitor 86 coupled between the common electrode 84 and ground.

Note that multiple stacked tunable acoustic resonators (e.g., the stacked tunable acoustic resonators 78) that are parallel to each other and coupled between the input node VP and the output node O/P may be used in the compensation circuit 44 (not shown). In addition, a single-source programmable DC voltage may be shared by these multiple stacked tunable acoustic resonators to precisely tune the equivalent capacitance of the compensation circuit 44.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. Filter circuitry comprising:
a first node and a second node;
a series resonator coupled between the first node and the second node; and
a compensation circuit coupled in parallel with the series resonator and located between the first node and the second node; wherein:
the compensation circuit includes a tunable acoustic resonator with at least one transduction structure;
the at least one transduction structure comprises at least one ferroelectric material, wherein polarization of the at least one ferroelectric material varies with an electric field across the at least one ferroelectric material; and
upon adjusting a direct current (DC) voltage applied to the tunable acoustic resonator, the compensation circuit is capable of providing a variable negative equivalent capacitance to at least partially cancel out an equivalent capacitance presented by the series resonator between the first node and the second node.

2. The filter circuitry of claim 1 wherein the at least one transduction structure is composed of a plurality of transduction layers, and at least one of the plurality of transduction layers is formed of one of the at least one ferroelectric material.

3. The filter circuitry of claim 2 wherein the at least one ferroelectric material comprises one or more of a group consisting of Scandium aluminum nitride (ScxAl1-xN) with variable scandium concentration x greater than 0 and less than 1, Lead Zirconate Titanate (PZT), Lead titanate (PTO), Barium Titanate (BTO), and Hafnium Oxide (HfO$_2$).

4. The filter circuitry of claim 1 wherein:
the compensation circuit further includes a first inductor and a second inductor;
the first inductor and the second inductor are coupled in series between the first node and the second node, wherein the first inductor and the second inductor are negatively coupled with one another, and a common node is provided between the first inductor and the second inductor; and
the tunable acoustic resonator is coupled between the common node and ground.

5. The filter circuitry of claim 4 wherein:
the compensation circuit further includes a resistor; and
the DC voltage is applied to the tunable acoustic resonator via the resistor.

6. The filter circuitry of claim 5 wherein:
the compensation circuit further includes a blocking capacitor; and
the blocking capacitor and the tunable acoustic resonator are coupled in series between the common node and ground.

7. The filter circuitry of claim 6 wherein the tunable acoustic resonator is a Bulk Acoustic Wave (BAW) resonator including a first electrode, a second electrode, and the at least one transduction structure coupled between the first electrode and the second electrode.

8. The filter circuitry of claim 7 wherein:
the first electrode is coupled to the common node;
the blocking capacitor is coupled between the second electrode and ground; and
the DC voltage is applied to the second electrode via the resistor.

9. The filter circuitry of claim 7 wherein:
the blocking capacitor is coupled between the common node and the first electrode;
the second electrode is coupled to ground; and
the DC voltage is applied to the first electrode via the resistor.

10. The filter circuitry of claim 4 wherein:
the tunable acoustic resonator includes a first electrode, a second electrode, a third electrode, and the at least one transduction structure;
the at least one transduction structure includes a first transduction structure and a second transduction structure, wherein the first electrode, the second electrode, and the first transduction structure coupled in between compose a first tunable BAW resonator, and the second electrode, the third electrode, and the second transduction structure coupled in between compose a second tunable BAW resonator;
the first electrode of the tunable acoustic resonator is coupled to the common node and the third electrode of the tunable acoustic resonator is coupled to ground; and
the DC voltage is applied to the second electrode of the tunable acoustic resonator.

11. The filter circuitry of claim 10 wherein:
the compensation circuit further includes a resistor; and
the DC voltage is applied to the second electrode of the tunable acoustic resonator via the resistor.

12. The filter circuitry of claim 10 wherein the first tunable BAW resonator and the second tunable BAW resonator have opposite acoustic polarization states, such that, for opposite DC voltage variations, an equivalent capacitance presented by the first tunable BAW resonator and an equivalent capacitance presented by the second tunable BAW resonator increase or decrease simultaneously.

13. The filter circuitry of claim 10 wherein the first tunable BAW resonator and the second tunable BAW resonator have a same acoustic polarization state with different scales, such that, for opposite DC voltage variations, an equivalent capacitance presented by the first tunable BAW resonator and an equivalent capacitance presented by the second tunable BAW resonator change oppositely, and an overall equivalent capacitance presented by the tunable acoustic resonator still varies with the applied DC voltage.

14. The filter circuitry of claim 10 wherein:
the first transduction structure is composed of a plurality of first transduction layers, and at least one of the plurality of first transduction layers is formed of one of the at least one ferroelectric material; and
the second transduction structure is composed of a plurality of second transduction layers, and at least one of the plurality of second transduction layers is formed of one of the at least one ferroelectric material.

15. The filter circuitry of claim 14 wherein the at least one ferroelectric material comprises one or more of a group consisting of $Sc_xAl_{1-x}N$ with variable scandium concentration x greater than 0 and less than 1, PZT, PTO, BTO, and $HfO_2$.

16. The filter circuitry of claim 14 wherein the first transduction structure and the second transduction structure comprise different ferroelectric materials.

17. The filter circuitry of claim 10 wherein the first electrode of the tunable acoustic resonator is directly coupled to the common node and the third electrode of the tunable acoustic resonator is directly coupled to ground.

18. The filter circuitry of claim 1 wherein:
the tunable acoustic resonator includes a first electrode, a second electrode, a third electrode, and the at least one transduction structure;
the at least one transduction structure includes a first transduction structure and a second transduction structure;
the first electrode, the second electrode, and the first transduction structure coupled in between compose a first tunable BAW resonator, and the second electrode, the third electrode, and the second transduction structure coupled in between compose a second tunable BAW resonator;
the first electrode of the tunable acoustic resonator is coupled to the first node, and the third electrode of the tunable acoustic resonator is coupled to the second node; and
the DC voltage is applied to the second electrode.

19. The filter circuitry of claim 18 wherein:
the compensation circuit further includes a blocking capacitor; and
the blocking capacitor is coupled between the second electrode and ground.

20. The filter circuitry of claim 18 wherein:
the compensation circuit further includes a resistor; and
the DC voltage is applied to the second electrode via the resistor.

* * * * *

UNITED STATES PATENT AND TRADEMARK OFFICE
CERTIFICATE OF CORRECTION

| | | |
|---|---|---|
| PATENT NO. | : 12,476,613 B2 | Page 1 of 1 |
| APPLICATION NO. | : 18/227033 | |
| DATED | : November 18, 2025 | |
| INVENTOR(S) | : Nadim Khlat | |

It is certified that error appears in the above-identified patent and that said Letters Patent is hereby corrected as shown below:

In the Specification

In Column 2, at Line 37, change "phase (4))" to read --phase ($\phi$)--

In Column 7, at Line 34, change "input node VP" to read --input node I/P--

In Column 8, at Line 60, change "input node VP" to read --input node I/P--

In Column 10, at Line 26, change "input node VP" to read --input node I/P--

In Column 10, at Line 28, change "node VP" to read --node I/P--

In Column 10, at Line 40, change "input node VP" to read --input node I/P--

In Column 11, at Line 29, change "input node VP" to read --input node I/P--

In Column 13, at Line 57, change "VP" to read --I/P--

Signed and Sealed this
Sixth Day of January, 2026

John A. Squires
*Director of the United States Patent and Trademark Office*